United States Patent
Tsuda et al.

(10) Patent No.: US 9,293,618 B2
(45) Date of Patent: Mar. 22, 2016

(54) THIN-FILM SOLAR BATTERY AND MANUFACTURING METHOD THEREOF

(75) Inventors: Yuki Tsuda, Tokyo (JP); Yusuke Nishikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 507 days.

(21) Appl. No.: 13/807,817

(22) PCT Filed: Jun. 15, 2011

(86) PCT No.: PCT/JP2011/063722
§ 371 (c)(1),
(2), (4) Date: Dec. 31, 2012

(87) PCT Pub. No.: WO2012/017742
PCT Pub. Date: Feb. 9, 2012

(65) Prior Publication Data
US 2013/0098424 A1    Apr. 25, 2013

(30) Foreign Application Priority Data
Aug. 6, 2010    (JP) .................................. 2010-178091

(51) Int. Cl.
*H01L 31/046*    (2014.01)
*H01L 31/056*    (2014.01)
(Continued)

(52) U.S. Cl.
CPC .... *H01L 31/0504* (2013.01); *H01L 31/022466* (2013.01); *H01L 31/046* (2014.12);
(Continued)

(58) Field of Classification Search
CPC .............. H01L 31/046; H01L 31/0463; H01L 31/0465; H01L 31/022466; H01L 31/0504; H01L 31/0506; H01L 31/1884
See application file for complete search history.

(56) References Cited

U.S. PATENT DOCUMENTS

| 5,512,107 A | 4/1996 | Van Den Berg |
| 2007/0007627 A1 | 1/2007 | Young et al. |

FOREIGN PATENT DOCUMENTS

| JP | 08 051229 | 2/1996 |
| JP | 2000 261009 | 9/2000 |

(Continued)

OTHER PUBLICATIONS

International Search Report Issued Sep. 20, 2011 in PCT/JP11/63722 Filed Jun. 15, 2011.

(Continued)

*Primary Examiner* — Marla D McConnell
(74) *Attorney, Agent, or Firm* — Oblon, McClelland, Maier & Neustadt, L.L.P.

(57) ABSTRACT

Cells including a first electrode layer, a photoelectric conversion layer, and a second electrode layer on a translucent substrate are connected. Between adjacent cells, a first separating groove separates the first electrode layer, a second separating groove separates the second electrode layer, and a connecting groove electrically connects the second electrode layer of a cell and the first electrode layer of the other. A reflective film is provided on the second electrode layer having a transparent conductive film and a metal film stacked in this order on the photoelectric conversion layer and at least the metal film is patterned into lines. The metal film is patterned into lines with a same width within the connecting groove and is connected to the first electrode layer of the adjacent cell. The reflective film is provided in the connecting groove where the metal film is not formed and in the second separating groove.

10 Claims, 7 Drawing Sheets

(51) Int. Cl.
*H01L 31/0465* (2014.01)
*H01L 31/05* (2014.01)
*H01L 31/0463* (2014.01)
*H01L 31/0224* (2006.01)
*H01L 31/18* (2006.01)

(52) U.S. Cl.
CPC ........ *H01L31/0463* (2014.12); *H01L 31/0465* (2014.12); *H01L 31/056* (2014.12); *H01L 31/1884* (2013.01); *Y02E 10/52* (2013.01)

(56) References Cited

FOREIGN PATENT DOCUMENTS

| | | |
|---|---|---|
| JP | 2003 031830 | 1/2003 |
| JP | 2010 278148 | 12/2010 |
| WO | 93 19491 | 9/1993 |
| WO | 2005 024920 | 3/2005 |
| WO | 2005 076370 | 8/2005 |
| WO | 2011 108241 | 9/2011 |

OTHER PUBLICATIONS

Office Action issued May 21, 2013, in Japanese Patent Application No. 2012-527634 with English translation.

Combined Chinese Office Action and Search Report issued Jan. 12, 2015 in Patent Application No. 201180038406.3 (with English language translation and English Translation of Categories of Cited Documents).

FIG.4-1
(a) 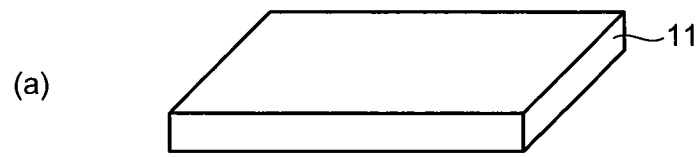
(b) 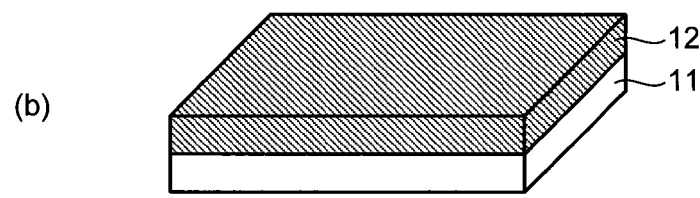
(c) 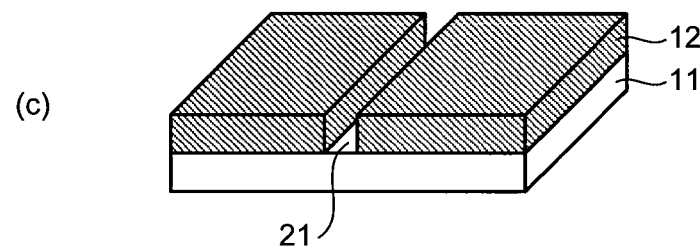
(d) 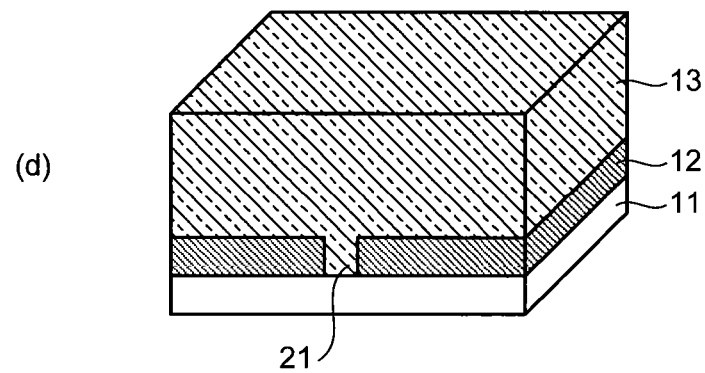

FIG.4-2
(a) 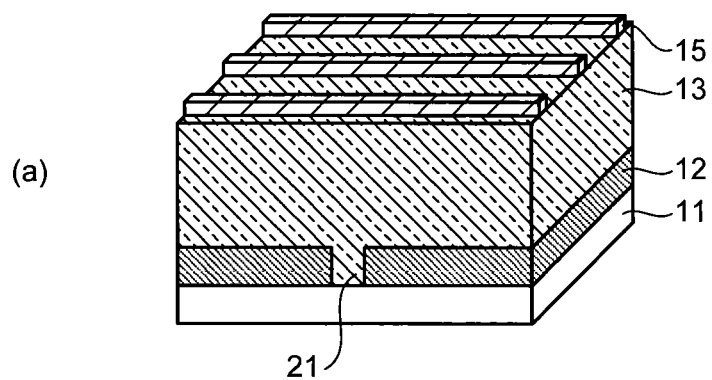
(b) 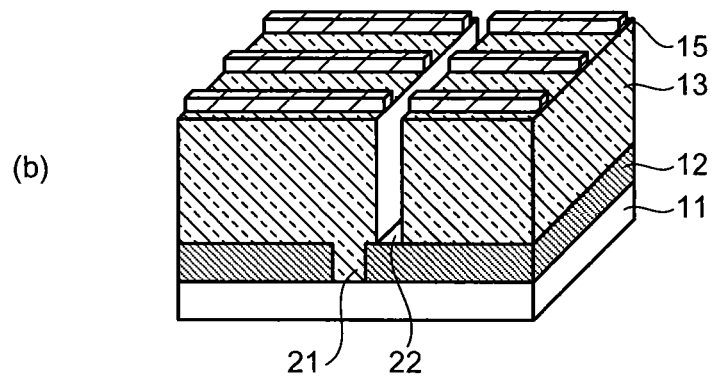
(c) 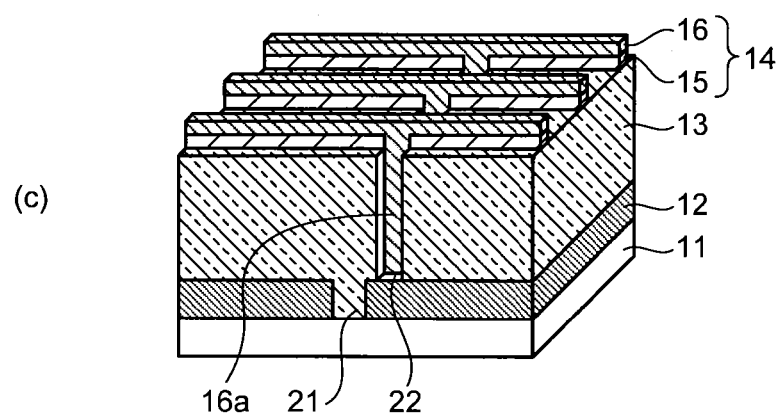

(a)

(b)

(a)

(b)

(c)

|  | SHORT-CIRCUIT CURRENT (mA) | OPEN CIRCUIT VOLTAGE (V) | FF | CONVERSION EFFICIENCY (%) |
|---|---|---|---|---|
| EXAMPLE 1 | 19.1 | 0.52 | 0.698 | 6.93 |
| EXAMPLE 2 | 18.3 | 0.53 | 0.720 | 6.98 |
| COMPARATIVE EXAMPLE | 17.8 | 0.53 | 0.725 | 6.84 |

THIN-FILM SOLAR BATTERY AND MANUFACTURING METHOD THEREOF

FIELD

The present invention relates to a thin-film solar battery and a manufacturing method thereof.

BACKGROUND

An integrated thin-film solar battery is generally formed by stacking a surface electrode layer made of a transparent conductive film, a photoelectric conversion layer made of a crystalline or amorphous semiconductor layer, and a back-surface electrode layer made of a metal thin film that serves as a reflector in this order on a translucent insulating substrate such as a glass substrate, which is a light receiving surface. In this type of thin-film solar battery, when the photoelectric conversion layer is made thin, its light conversion amount is decreased. Therefore, light is diffused by utilizing a surface electrode layer on an incident side and a back-surface electrode layer to increase an optical path length in the photoelectric conversion layer in order to increase the light conversion amount.

In relation to the thin-film solar battery having the above structure, there has been proposed a thin-film solar battery having a structure in which only a transparent conductive film is used as a back-surface electrode layer without using any metal thin film, and a highly-reflective white insulating layer is arranged on a back side of the transparent conductive film to achieve back-surface reflection having a high light diffusion effect (see, for example, Patent Literature 1). There has been further proposed a thin-film solar battery having a structure in which a transparent conductive film is formed on the entire surface of a photoelectric conversion layer and a comb-shaped metal electrode is arranged on the transparent conductive film to form a back-surface electrode layer, a translucent insulating film is formed on the comb-shaped metal electrode, and a back-surface reflective film is further formed on the translucent insulating film (see, for example, Patent Literature 2).

CITATION LIST

Patent Literatures

Patent Literature 1: International Publication No. WO 2005/076370
Patent Literature 2: Japanese Patent Application Laid-open No. H8-51229

SUMMARY

Technical Problem

In Patent Literature 2 mentioned above, a back-surface reflective film is formed of a metal film on a comb-shaped metal electrode through a translucent insulating film. However, there is a problem in that the metal film causes specular reflection and therefore is not very effective in dispersing light and increasing the optical path length. In Patent Literatures 1 and 2, adjacent cells (photoelectric conversion devices) are connected by a transparent conductive film that constitutes a back-surface electrode layer, and therefore the transparent conductive film on the back surface has to be made thick in order to reduce a connection resistance. However, there is also a problem in that thickening of the transparent conductive film causes absorption of light reflected from the back surface to be great.

The present invention has been achieved to solve the above problems, and an object of the present invention is to provide a thin-film solar battery that can reflect light passing through to a back-surface side of a photoelectric conversion layer back to the photoelectric conversion layer to appropriately convert the light into electricity and can maintain a connection resistance between adjacent cells low, and a manufacturing method of the thin-film solar battery.

Solution to Problem

There is provided a thin-film solar battery according to an aspect of the present invention in which a cell including a first electrode layer made of a transparent conductive material, a photoelectric conversion layer made of a semiconductor material, and a second electrode layer made of a conductive material is formed on a translucent substrate, and a plurality of the cells are connected in series, wherein the thin-film solar battery further includes, between adjacent cells of the plurality of the cells, a first electrode layer separating groove that separates the first electrode layer between adjacent cells, a second electrode layer separating groove that separates the second electrode layer between adjacent cells, and a cell connecting groove that is provided between the first electrode layer separating groove and the second electrode layer separating groove, and electrically connects the second electrode layer of one cell of the adjacent cells and the first electrode layer of the other cell, and includes a reflective film made of a white insulating layer on the second electrode layer, the second electrode layer has a structure in which a transparent conductive film and a metal film are stacked in this order on the photoelectric conversion layer and at least the metal film is patterned into lines, the metal film is patterned into lines with a same line width within the connecting groove and is connected to the first electrode layer of the adjacent cell, and the reflective film is provided in an area of the connecting groove where the metal film is not formed and in the second electrode layer separating groove.

Advantageous Effects of Invention

According to the present invention, a second electrode layer on a photoelectric conversion layer is constituted by a stacked film including a transparent conductive film and a metal film, at least the metal film is patterned into lines, and a reflective film made of a white insulating layer is provided on the second electrode layer. Therefore, light absorption by the second electrode layer can be substantially reduced. Furthermore, due to diffusion and reflection of the light by the white insulating layer among the second electrode layer patterned into lines, light absorption loss in a layer that exists between the white insulating layer and the photoelectric conversion layer can be reduced, when light once having passed through the photoelectric conversion layer is caused to return to the photoelectric conversion layer. Further, because the white insulating layer is filled not only on a back-surface side of the photoelectric conversion layer but also in an area between adjacent cells except for the metal film, it is possible to diffuse and reflect light into the photoelectric conversion layer in contrast to a conventional structure in which light passes through to a side surface of the cell after entering the photoelectric conversion layer. Accordingly, a light conversion amount in the photoelectric conversion layer can be increased. Furthermore, because adjacent cells are connected by a metal film with linear structure, a connection resistance between cells can be kept lower as compared to a conventional example in which adjacent cells are connected by a transparent conductive film.

BRIEF DESCRIPTION OF DRAWINGS

FIG. 4-1 is a perspective view schematically depicting an example of a manufacturing method of the thin-film solar battery according to the first embodiment of the present invention (part 1).

FIG. 4-2 is a perspective view schematically depicting an example of the manufacturing method of the thin-film solar battery according to the first embodiment of the present invention (part 2).

FIG. 4-3 is a perspective view schematically depicting an example of the manufacturing method of the thin-film solar battery according to the first embodiment of the present invention (part 3).

DESCRIPTION OF EMBODIMENTS

Embodiments of a thin-film solar battery and a manufacturing method thereof according to the present invention will be explained below in detail with reference to the accompanying drawings. The present invention is not limited to the embodiments. Cross-sectional views of a thin-film solar battery, which are referred to in the following embodiments, are schematic diagrams and therefore the relationship between a layer thickness and a layer width, the thickness ratio between layers, and the like shown in these cross-sectional views are different from those used in practice.

First Embodiment

Figure 1:
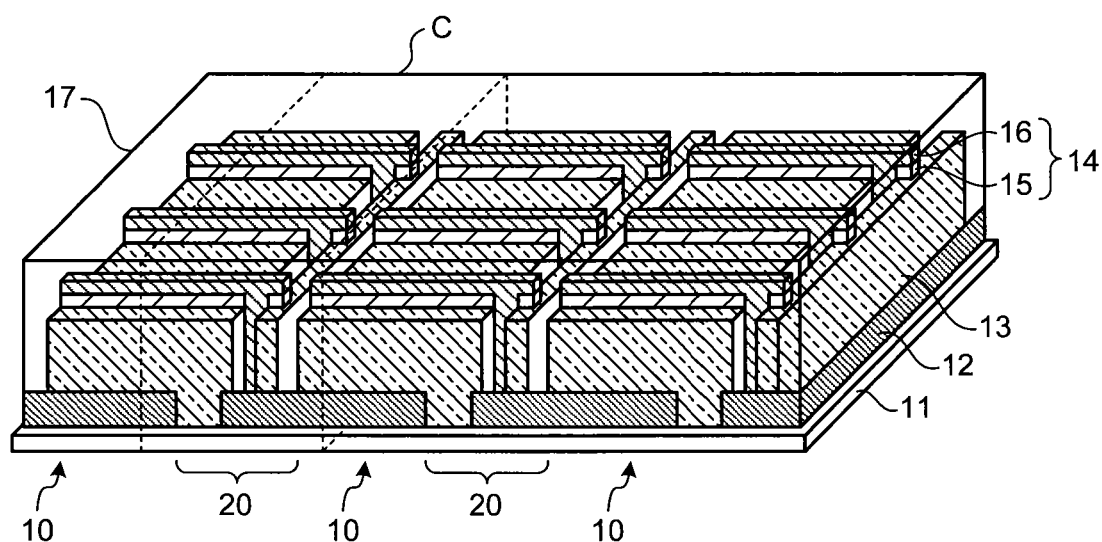
FIG. 1 is a perspective view schematically depicting a configuration of a thin-film solar battery according to a first embodiment of the present invention.
Figure 2:
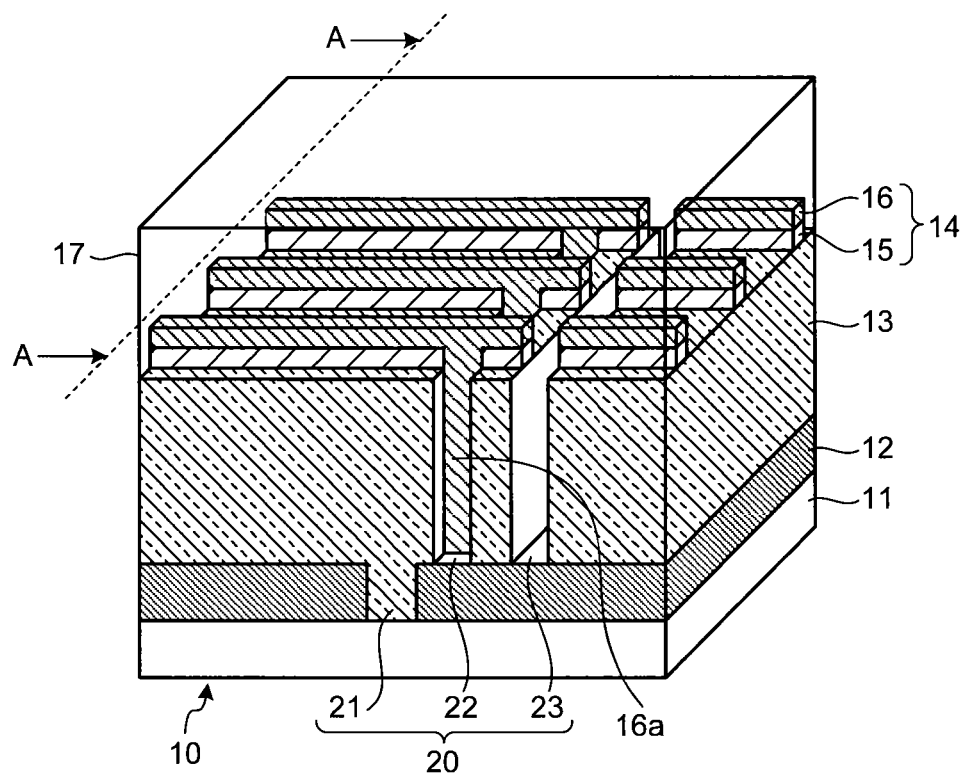
FIG. 2 is an enlarged perspective view of a part of the thin-film solar battery in FIG. 1.
Figure 3:
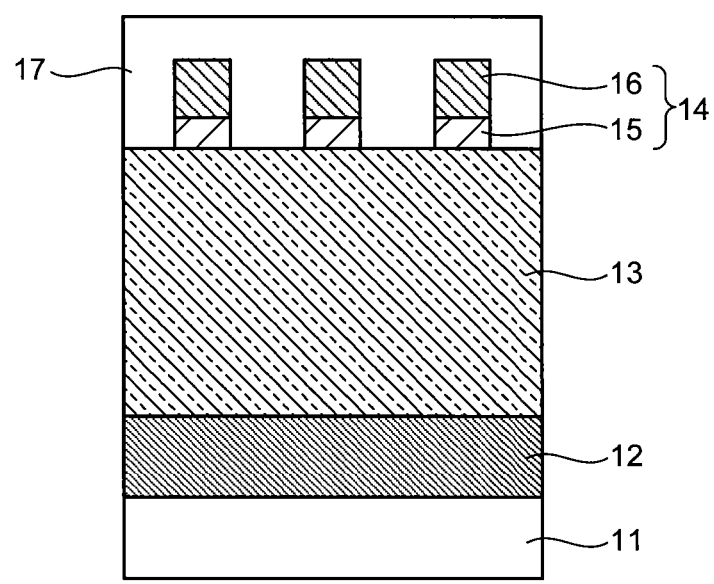
FIG. 3 is a cross-sectional view taken along a line A-A in FIG. 2.

FIG. 1 is a perspective view schematically depicting a configuration of a thin-film solar battery according to a first embodiment of the present invention, FIG. 2 is an enlarged perspective view of a part of the thin-film solar battery in FIG. 1, and FIG. 3 is a cross-sectional view taken along a line A-A in FIG. 2. FIG. 2 is an enlarged diagram of a partially cut-away portion C of the thin-film solar battery in FIG. 1.

In the thin-film solar battery according to the first embodiment, a plurality of unit solar battery cells 10 that are photoelectric conversion devices are connected in series and integrated on a transparent insulating substrate 11. In this manner, the entirety of the thin-film solar battery functions as a thin-film solar battery module. Although not shown in FIG. 1, current extracting units that extract currents to outside are provided at both ends of the unit solar battery cells 10 that are connected in series. The unit solar battery cells 10 are separated from each other and the unit solar battery cell 10 and the current extracting unit are separated from each other by scribe lines 20, which serve as grooves. Adjacent scribe lines 20 are arranged substantially in parallel to each other.

The unit solar battery cells 10 are formed by separating a stacked body, including a surface electrode layer 12, a photoelectric conversion layer 13, and a back-surface electrode layer 14 that are stacked in this order on the transparent insulating substrate 11, by the scribe lines 20 provided at predetermined positions. A white insulating layer 17 that is a reflective layer is provided on the back-surface electrode layer 14.

The transparent insulating substrate 11 is made of an insulating material with high transparency, and is not particularly limited as long as each thin film can be deposited thereon. For example, a glass material with a high optical transmittance such as a white glass or a translucent organic film material such as polyimide can be used. In addition, the surface electrode layer 12 can be a transparent conductive film with optical transmission properties, and a transparent conductive oxide material such as stannous oxide ($SnO_2$), zinc oxide (ZnO), or indium tin oxide (hereinafter, "ITO") can be used. Furthermore, preferably, the surface electrode layer 12 has a surface texture structure in which unevennesses are formed on a surface. The texture structure has a function of diffusing incident solar light to enhance light use efficiency in the photoelectric conversion layer 13.

The photoelectric conversion layer 13 has a pn junction or a pin junction, and is constituted by stacking one or more thin-film semiconductor layers that generate electricity from incident light. When the photoelectric conversion layer 13 is made of a silicon-based thin film, an amorphous silicon thin film or a microcrystal silicon thin film is used as the photoelectric conversion layer 13. The amorphous silicon thin film is a thin film containing silicon referred to as "hydrogenated amorphous silicon" in which a dangling bond is usually terminated by hydrogen. The microcrystal silicon thin film is a thin film containing microcrystalline silicon partially containing amorphous silicon. When the photoelectric conversion layer 13 is constituted by stacking a plurality of thin-film semiconductor layers, a plurality of different bandgap thin-film semiconductor layers are stacked, and accordingly the photoelectric conversion layer 13 can convert a wider spectrum of light into electricity highly efficiently.

When the photoelectric conversion layer 13 is constituted by stacking a plurality of thin-film semiconductor layers, an intermediate layer made of a conductive oxide material such as $SnO_2$, ZnO, or ITO, or other materials can be inserted between different thin-film semiconductor layers to improve the electrical and optical connection between the different thin-film semiconductor layers.

The back-surface electrode layer 14 has a linear structure having a width of 10 micrometers to 1 millimeter on the photoelectric conversion layer 13. In the examples in FIGS. 1 to 3, the back-surface electrode layer 14 is constituted by arranging a plurality of fine lines that are made of a conductive material and that extend in a direction substantially perpendicular to the scribe line 20 on the photoelectric conversion layer 13 at a predetermined interval in a direction in which the scribe line 20 extends. For example, the back-surface electrode layer 14 has a comb-shaped electrode structure which has an electrode width of 10 micrometers to 1 millimeter and is formed with a pitch of 10 micrometers to 1 millimeter. The back-surface electrode layer 14 is made of a conductive material including a transparent conductive oxide material such as $SnO_2$, ZnO, or ITO on at least an interface with the photoelectric conversion layer 13. In the first embodiment, the back-surface electrode layer 14 has a structure in which a transparent conductive film 15 made of $SnO_2$, ZnO, ITO, and the like and having a thickness of 10 to 1,000 nanometers and a metal film 16 having a thickness of 100 to 1,000 nanometers are stacked on the photoelectric conversion layer 13.

The transparent conductive film 15 has a function as a diffusion prevention film. That is, if the metal film 16 is formed on the photoelectric conversion layer 13 in a directly contacting manner, metal that constitutes the metal film 16 is diffused into a silicon layer that constitutes the photoelectric conversion layer 13, and accordingly photoelectric conversion properties deteriorate. To prevent this, the transparent conductive film 15 is provided between the photoelectric conversion layer 13 and the metal film 16. Furthermore, the metal film 16 is desirably made of a high-conductivity metal material with high reflectivity to suppress reduction in reflectivity caused by an electrode, and Ag can be used for the metal film 16.

The white insulating layer 17 is formed with a thickness of 10 micrometers to 1 millimeter on the photoelectric conversion layer 13 on which the back-surface electrode layer 14 is formed. The white insulating layer 17 contains binder resin and white pigment made of titanium oxide particles, barium sulfate particles, and the like. As the binder resin, synthetic resin can be used such as polyurethane-based resin, acrylic-based resin, epoxy-based resin, vinyl-based resin, polyester-based resin, polyamide-based resin, or rubber-based resin.

As shown in FIGS. 1 and 2, in practice, the scribe line 20 includes a first scribe line 21 that separates the surface electrode layer 12, a second scribe line 22 that separates the photoelectric conversion layer 13, and a third scribe line 23 that separates the photoelectric conversion layer 13 and the back-surface electrode layer 14.

The first scribe line 21 is provided to separate the surface electrode layer 12 between adjacent unit solar battery cells 10, and is embedded with the photoelectric conversion layer 13. The second scribe line 22 is provided to form a contact that connects the back-surface electrode layer 14 to the surface electrode layer 12 of the adjacent unit solar battery cell 10, and is embedded with the metal film 16 to be connected to the surface electrode layer 12 exposed at a bottom of a position where the back-surface electrode layer 14 is formed within the second scribe line 22, while being embedded with the white insulating layer 17 at other positions. That is, the back-surface electrode layer 14 and the surface electrode layer 12 between the adjacent unit solar battery cells 10 are connected by the metal film 16, thereby providing a structure in which the unit solar battery cells 10 are connected in series. Furthermore, the third scribe line 23 is provided to separate the photoelectric conversion layer 13 and the back-surface electrode layer 14 between the adjacent unit solar battery cells 10, and is embedded with the white insulating layer 17 to electrically insulate the adjacent unit solar battery cells 10 from each other.

An outline of an operation of the thin-film solar battery having the structure as described above is explained below. When solar light enters from a back surface of the transparent insulating substrate 11 (a surface on which the unit solar battery cell 10 is not formed), a free carrier is generated in an i-type semiconductor layer of the photoelectric conversion layer 13. The free carrier generated as described above is transported by a built-in electric field formed by a p-type semiconductor layer and an n-type semiconductor layer of the photoelectric conversion layer 13 to generate a current. The current generated in each of the unit solar battery cells 10 passes through a connecting part 16a between the surface electrode layer 12 and the back-surface electrode layer 14 within the second scribe line 22, and flows into the adjacent unit solar battery cell 10, thereby generating a current for generating electricity in the entirety of a thin-film solar battery module. Because the connecting part 16a is made of the metal film 16, a connection resistance between the unit solar battery cells 10 can be lower as compared to a case where the connecting part 16a is made of a transparent conductive film.

At this time, a part of solar light having entered from the back surface of the transparent insulating substrate 11 but not converted into electricity passes through the photoelectric conversion layer 13 and reaches the white insulating layer 17. However, the part is diffused and reflected by the white insulating layer 17 and then returned to the photoelectric conversion layer 13. The white insulating layer 17 is filled not only on a back-surface side of the photoelectric conversion layer 13, but also in an area within the second scribe line 22 except for the metal film 16 and in the third scribe line 23. Therefore, the white insulating layer 17 diffuses and reflects light into the photoelectric conversion layer 13 in contrast to a conventional structure in which light passes through to the scribe line 20 after having entered into the photoelectric conversion layer 13. Accordingly, light having returned into the photoelectric conversion layer 13 is converted into electricity by the photoelectric conversion layer 13 as described above.

Figure 4:
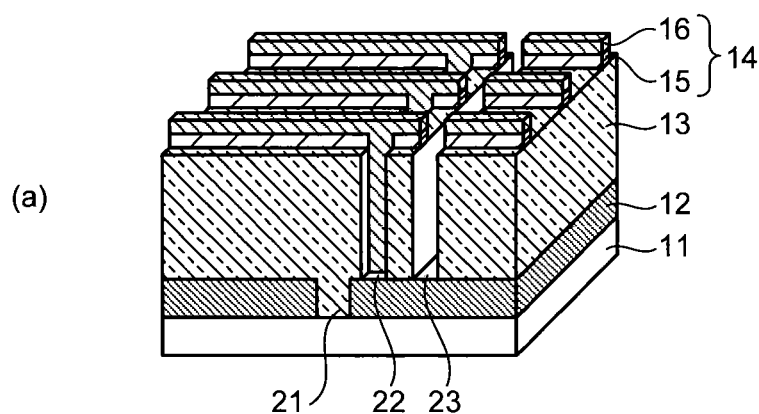
Figure 3:
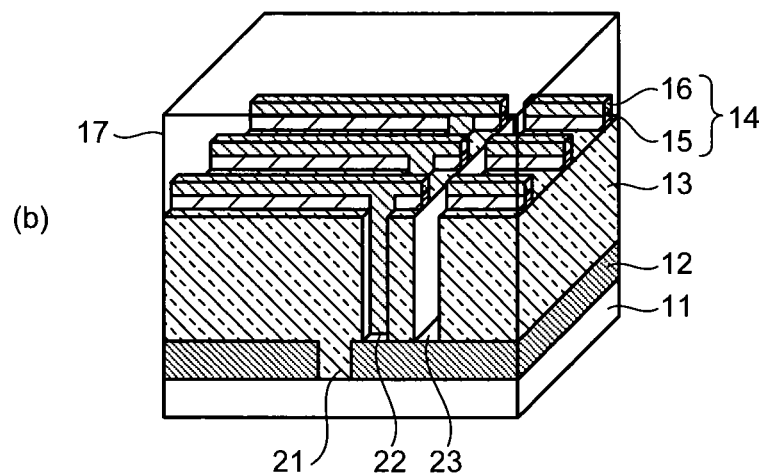

Next, a manufacturing method of a thin-film solar battery having the above structure is explained. FIGS. 4-1 to 4-3 are perspective views schematically depicting an example of a manufacturing method of the thin-film solar battery according to the first embodiment of the present invention. FIGS. 4-1 to 4-3 depict only a part of a thin-film solar battery.

As shown in FIG. 4-1(a), the transparent insulating substrate 11 is prepared first. A transparent glass substrate is used as the transparent insulating substrate 11, for example. Next, as shown in FIG. 4-1(b), the surface electrode layer 12 is formed on the transparent insulating substrate 11 by a film-forming method such as a low-pressure chemical vapor deposition (CVD) method or sputtering method. A layer containing a transparent conductive oxide material such as $SnO_2$, ZnO, or ITO can be used as the surface electrode layer 12, for example. When the surface electrode layer 12 is formed by the sputtering method, an upper surface of the surface electrode layer 12 can be roughened by etching using dilute hydrochloric acid and the like to form a fine uneven surface structure that functions to confine incident light in the photoelectric conversion layer 13. Furthermore, when the surface electrode layer 12 is formed by the CVD method, a fine uneven surface structure is formed on a surface of the transparent conductive film 15 in a self-organized manner. Therefore, it becomes unnecessary to perform a surface roughening process by etching using dilute hydrochloric acid and the like.

Next, a laser beam is irradiated to a predetermined position on the surface electrode layer 12 by a laser scribing method to form the first scribe line 21. Patterning is performed to separate the surface electrode layer 12 in the respective unit solar battery cells 10. Patterning of the surface electrode layer 12 can be performed by using a combination of a photolithography method and an etching method, mechanical machining, and the like. At the time of forming the surface electrode layer 12 on the transparent insulating substrate 11, a metal mask, in which openings are provided corresponding to positions where the surface electrode layer 12 is formed on the transparent insulating substrate 11, can be used to form the surface electrode layer 12 separated into the respective unit solar battery cells 10 on the transparent insulating substrate 11.

Next, as shown in FIG. 4-1(d), the photoelectric conversion layer 13 is formed on the transparent insulating substrate 11 on which the surface electrode layer 12 is formed. The photoelectric conversion layer 13 is made of a thin-film semiconductor layer in which the p-type semiconductor layer, the i-type semiconductor layer, and the n-type semiconductor layer are stacked in this order from a side of the transparent insulating substrate 11, for example. The arrangement of the p-type semiconductor layer and the n-type semiconductor layer can be reversed, and the i-type semiconductor layer may not be used according to the type of semiconductor. A plurality of thin-film semiconductor layers different in bandgap can be stacked to constitute the photoelectric conversion layer 13. An amorphous silicon film or a microcrystal silicon film can be used as the photoelectric conversion layer 13, for example, and the photoelectric conversion layer 13 can be formed by a film-forming method such as a plasma CVD method.

Thereafter, as shown in FIG. 4-2(a), the transparent conductive film 15 that extends in a direction perpendicular to a direction in which the first scribe line 21 extends and that is arranged with a predetermined pitch in the extending direction of the first scribe line 21 is formed on the photoelectric conversion layer 13 with, for example, a thickness of 10 to 1,000 nanometers. For example, a mask with an opening pattern, in which openings extend in a direction perpendicular to the extending direction of the first scribe line 21 and are arranged with a predetermined pitch in the extending direction of the first scribe line 21, can be used to form a film made of a transparent conductive oxide material such as $SnO_2$, ZnO, or ITO by a film-forming method such as the sputtering method. Accordingly, the transparent conductive film 15 in a comb shape extending in a direction perpendicular to the first scribe line 21 is formed on the photoelectric conversion layer 13. The transparent conductive film 15 can have a width of 10 micrometers to 1 millimeter and the pitch between the lines of the transparent conductive film 15 can be 10 micrometers to 1 millimeter. While the method of forming the comb-shaped transparent conductive film 15 by the sputtering method using mask patterning has been explained above, the low-pressure CVD method using mask patterning and the like can be also used. In addition, as the shape of the transparent conductive film 15, a lattice shape, a honeycomb structure shape, and the like can be also used other than a comb shape.

Next, as shown in FIG. 4-2(b), a laser beam is irradiated to a predetermined position of the transparent conductive film 15 and the photoelectric conversion layer 13 by a laser scribing method to form the second scribe line 22. The second scribe line 22 is formed in parallel to the first scribe line 21 at a position that is different from the position where the first scribe line 21 is formed.

Thereafter, as shown in FIG. 4-2(c), the metal film 16 is formed on the transparent conductive film 15 to form the back-surface electrode layer 14 constituted by a stacked structure including the transparent conductive film 15 and the metal film 16. For example, the metal film 16 can be formed on the transparent conductive film 15 by a film-forming method such as the vapor deposition method by using a mask with an opening pattern, in which openings extend in a direction perpendicular to the extending direction of the first scribe line 21 and are arranged with the same pitch as that of the transparent conductive film 15 in the extending direction of the first scribe line 21. At this time, the metal film 16 is embedded at a position where the second scribe line 22 and the opening pattern of the mask intersect, so as to form the connecting part 16a that connects the back-surface electrode layer 14 and the surface electrode layer 12. A silver thin film having a thickness of 100 to 1,000 nanometers can be used as the metal film 16. As another method of stacking the metal film 16 on the transparent conductive film 15, a sputtering method using mask patterning, a screen-printing method, and the like can be also used.

Next, as shown in FIG. 4-3(a), a laser beam is irradiated to a predetermined position of the photoelectric conversion layer 13, the transparent conductive film 15, and the metal film 16 by a laser scribing method to form the third scribe line 23. The third scribe line 23 is formed in parallel to the first and second scribe lines 21 and 22 at a position different from the positions where the first and second scribe lines 21 and 22 are respectively formed. Accordingly, the back-surface electrode layer 14 and the photoelectric conversion layer 13 between adjacent unit solar battery cells 10 are electrically insulated.

As shown in FIG. 4-3(b), the white insulating layer 17 is formed with a thickness of 10 to 1,000 micrometers on the photoelectric conversion layer 13 on which the back-surface electrode layer 14 is formed, by using a screen-printing method, a spray coating method, and the like. At this time, the white insulating layer 17 is embedded in an area of the second scribe line 22 where the metal film 16 is not formed and in the third scribe line 23. The white insulating layer 17 is made of white pigment made of titanium oxide particles, barium sulfate particles, and the like and binder resin made of synthetic resin such as polyurethane-based resin, acrylic-based resin, epoxy-based resin, vinyl-based resin, polyester-based resin, polyamide-based resin, or rubber-based resin. The thin-film solar battery shown in FIGS. 1 to 3 is manufactured in the manner as described above.

Figure 5:
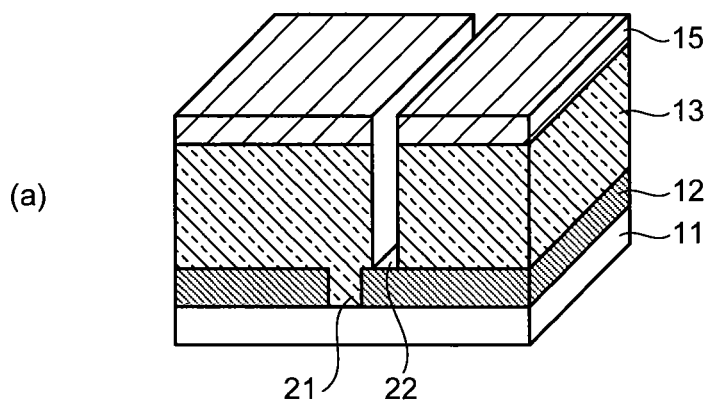
FIG. 5 is a perspective view schematically depicting another example of the manufacturing method of the thin-film solar battery according to the first embodiment of the present invention.
Figure 5:
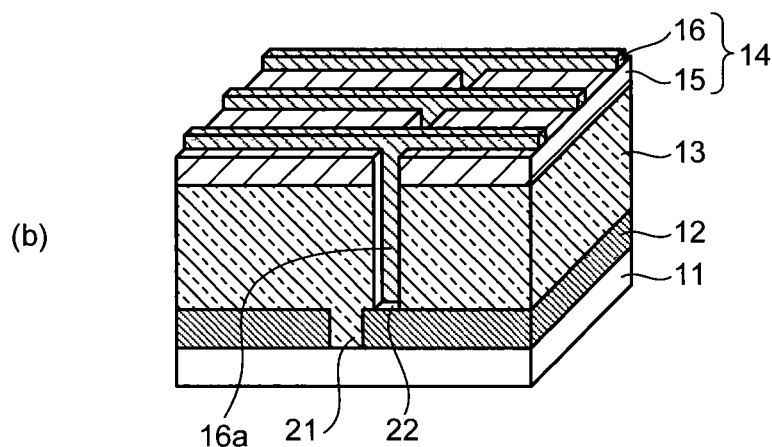
Figure 5:
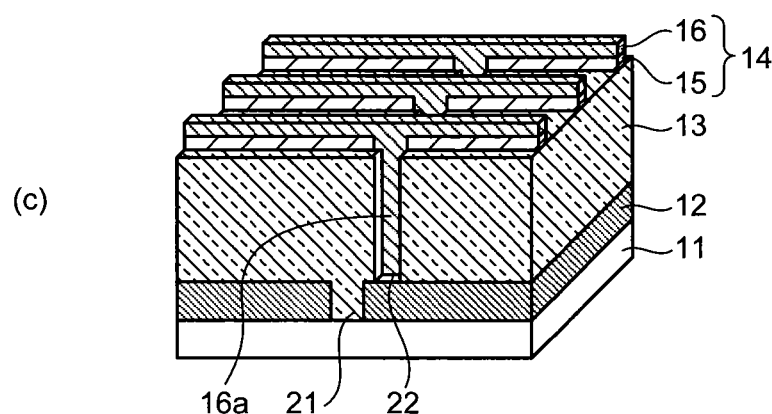

When a ZnO-based material capable of being easily etched by using hydrochloric acid and the like is used for the transparent conductive film 15, the thin-film solar battery can be also manufactured by a method different from the above manufacturing method. FIG. 5 is a perspective view schematically depicting another example of the manufacturing method of the thin-film solar battery according to the first embodiment of the present invention. In the manufacturing method shown in FIG. 5, processes up to FIG. 4-1(d) are identical to those in the manufacturing method of FIGS. 4-1(a) to 4-1(d), and thus explanations thereof will be omitted.

After the photoelectric conversion layer 13 is formed on the transparent insulating substrate 11 as shown in FIG. 4-1(d), the transparent conductive film 15 is formed on the entire surface of the photoelectric conversion layer 13 as shown in FIG. 5(a), and a laser beam is irradiated to a predetermined position of the transparent conductive film 15 and the photoelectric conversion layer 13 by a laser scribing method to form the second scribe line 22. A ZnO-based film having a thickness of 10 to 1,000 nanometers and capable of being etched by using hydrochloric acid and the like can be used as the transparent conductive film 15. The second scribe line 22 is formed substantially in parallel to the first scribe line 21 at a position different from the position where the first scribe line 21 is formed.

Next, as shown in FIG. 5(b), the metal film 16 is formed on the transparent conductive film 15. The metal film 16 is patterned into lines extending in a direction perpendicular to the extending direction of the first scribe line 21 with a predetermined pitch in the extending direction of the first scribe line 21. A material that is hardly dissolved in an etching solution used at the time of a subsequent wet-etching process to the transparent conductive film 15 is used as the metal film 16. For example, a silver thin film having a thickness of 100 to 1,000 nanometers can be used as the metal film 16. As described above, this metal film 16 with linear structure can be formed by a film-forming method such as a vapor deposition method or a sputtering method using mask patterning, a screen-printing method, and the like. The metal film 16 is embedded in the second scribe line 22 at a position where the metal film 16 and the second scribe line 22 intersect, so as to form the connecting part 16a that connects the back-surface electrode layer 14 and the surface electrode layer 12.

Thereafter, as shown in FIG. 5(c), the metal film 16 with a linear structure is used as a mask to etch the transparent conductive film 15 by wet etching. For example, hydrochloric acid and the like can be used as an etching solution. As a result, similarly to the metal film 16, the transparent conductive film 15 also has a linear structure. As a result, the back-surface electrode layer 14 with stacked structure including the transparent conductive film 15 and the metal film 16 both having the linear structure is formed. At this time, although the surface electrode layer 12 contacts the etching solution through an area of the second scribe line 22 where the metal film 16 is not in contact with (not formed), because $SnO_2$ or ITO that is hardly dissolved in hydrochloric acid and the like is used for the surface electrode layer 12, the surface electrode layer 12 is not etched, and thus it is not influenced by the etching solution. Furthermore, even in a case where ZnO is used for the surface electrode layer 12, if the surface electrode layer 12 is formed with a sufficient thickness with respect to the transparent conductive film 15 on the back-surface side, an influence of the etching solution on the surface electrode layer 12 can be almost eliminated by adjusting an etching time.

Thereafter, the thin-film solar battery shown in FIGS. 1 to 3 is manufactured according to the procedures shown in FIGS. 4-3. By using the processes as described above, the back-surface electrode layer 14 constituted by a stacked structure including the transparent conductive film 15 and the metal film 16 both having the linear structure can be produced more easily as compared to the method shown in FIGS. 4-1 to 4-3.

According to the first embodiment, the unit solar battery cells 10 (photoelectric conversion devices) are connected in series by using the metal film 16 with fine linear structure for the back-surface electrode layer 14 on the photoelectric conversion layer 13 to maintain a series resistance low, while the white insulating layer 17 is provided immediately above the photoelectric conversion layer 13 except for the metal film 16 with fine linear structure. Therefore, when solar light enters a layer above the photoelectric conversion layer 13, the layer is the back-surface electrode layer 14 with fine linear structure, and accordingly absorption of the solar light is suppressed and light use efficiency is enhanced. Furthermore, the white insulating layer 17 is filled not only on the back-surface side of the photoelectric conversion layer 13, but also in an area except for the connecting part 16a made of the metal film 16 embedded in the first and second scribe lines 21 and 22. Therefore, in contrast to a conventional structure in which light passes through to a side surface of the unit solar battery cell 10 after entering the photoelectric conversion layer 13, the white insulating layer 17 diffuses and reflects the light into the photoelectric conversion layer 13, and accordingly the light conversion amount in the photoelectric conversion layer 13 can be increased. As a result, a larger amount of solar light returns to the photoelectric conversion layer 13 as compared to the conventional structure, and accordingly photoelectric conversion efficiency is enhanced.

Second Embodiment

Figures 6, 7:
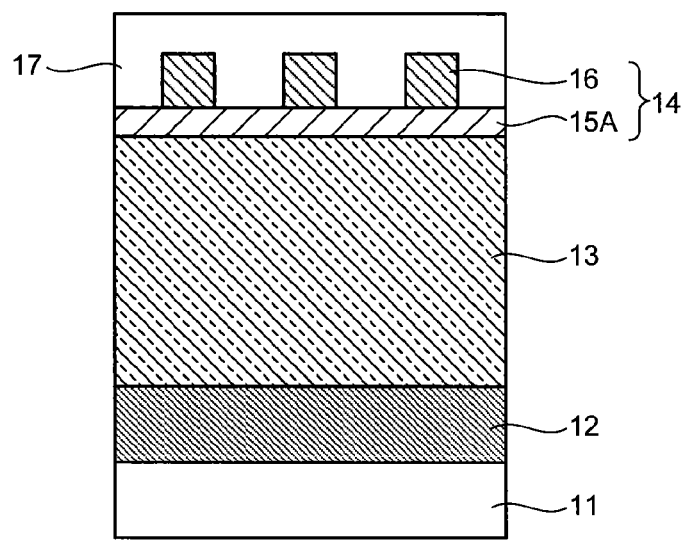
FIG. 6 is a cross-sectional view schematically depicting an example of a structure of a thin-film solar battery according to a second embodiment of the present invention.
FIG. 7 depicts characteristics of thin-film solar batteries according to Examples and a comparative example.

FIG. 6 is a cross-sectional view schematically depicting an example of a structure of a thin-film solar battery according to a second embodiment of the present invention. In this example, the back-surface electrode layer 14 has a stacked structure including a transparent conductive film 15A formed with a thickness of 10 to 500 nanometers on the entire surface of the photoelectric conversion layer 13 and the metal film 16 with fine linear structure formed on the transparent conductive film 15A. The metal film 16 is provided to extend in a direction perpendicular to the scribe lines 20 similarly to the first embodiment. The metal film 16 has a width of 10 to 1,000 micrometers and the pitch between the fine lines of the metal film 16 is 100 micrometers to 10 millimeters. In this example, when the thickness of the transparent conductive film 15A is smaller than 10 nanometers, the transparent conductive film 15A cannot effectively suppress diffusion of the metal element that constitutes the metal film 16 into the photoelectric conversion layer 13. When the thickness of the transparent conductive film 15A is larger than 500 nanometers, the attenuation amount of solar light in the transparent conductive film 15A is almost at the same level as in a thin-film solar battery having a conventional structure. Therefore, the thickness of the transparent conductive film 15A is desirably within the range mentioned above. The thickness of the transparent conductive film 15A can be 10 to 300 nanometers to further decrease the attenuation amount of solar light.

As described above, in the second embodiment, the transparent conductive film 15A that constitutes the back-surface electrode layer 14 is made thin and provided on the entire surface of the photoelectric conversion layer 13, and the metal film 16 with fine linear structure is provided on the transparent conductive film 15A to reduce the rate of solar light absorbed in the transparent conductive film 15A.

In the second embodiment, constituent elements identical to those of the first embodiment are denoted by like reference signs and explanations thereof will be omitted. In addition, the thin-film solar battery having the structure as described above can be manufactured by the same method as in the first embodiment except that the transparent conductive film 15A that constitutes the back-surface electrode layer 14 is formed on the entire surface of the photoelectric conversion layer 13. Therefore, explanations of the manufacturing method will be omitted.

In the second embodiment, the transparent conductive film 15A that constitutes the back-surface electrode layer 14 is formed to be considerably thin. Therefore, effects identical to those of a case when the white insulating layer 17 is provided immediately above the photoelectric conversion layer 13 can be achieved. Furthermore, the transparent conductive film 15A has a higher conductivity in a direction vertical to the stacked direction as compared to the photoelectric conversion layer 13. Therefore, a series resistance can be decreased without the need for fine patterning as compared to the first embodiment, in which the fine linear transparent conductive film 15 is used directly on the photoelectric conversion layer 13. In addition, because the transparent conductive film 15A does not need to be patterned into fine lines, the transparent conductive film 15A can be easily formed.

Examples of the thin-film solar batteries according to the embodiments of the present invention are described with a comparative example.

<Structure>

The thin-film solar battery having the structure shown in FIGS. 2 and 3 according to the first embodiment is used as a thin-film solar battery of an Example 1. The thin-film solar battery having the structure shown in FIG. 6 according to the second embodiment is used as a thin-film solar battery of an Example 2. A glass substrate is used as the transparent insulating substrate 11. An Al-doped ZnO (hereinafter, "AZO") film having a thickness of 1 micrometer is used as the surface electrode layer 12. A microcrystal silicon film having a thickness of 1 micrometer is used as the photoelectric conversion layer 13. In the Example 1, an AZO film having a thickness of 90 nanometers is used as the transparent conductive film 15 that constitutes the back-surface electrode layer 14. In the Example 2, an AZO film having a thickness of 300 nanometers is used as the transparent conductive film 15A that constitutes the back-surface electrode layer 14. In addition, an Ag film having a thickness of 300 nanometers is used as the metal film 16 that constitutes the back-surface electrode layer 14. A mixture of titanium oxide with acrylic-based binder resin is used for the white insulating layer 17.

As a thin-film solar battery of the comparative example, there is used the thin-film solar battery according to the first embodiment shown in FIGS. 2 and 3, in which the back-surface electrode layer 14 is made of only AZO of a transparent conductive film having a thickness of 1.5 micrometers (in which the metal film 16 is not formed). Other elements in the structure of the comparative example are the same as those in the Example 1.

<Evaluation Method>

In the thin-film solar batteries produced as described above, simulated solar light is irradiated from a side of the transparent insulating substrate 11 by a solar simulator, and current-voltage characteristics thereof are measured to determine a short-circuit current density, an open circuit voltage, a fill factor, and conversion efficiency.

<Evaluation Result>

FIG. 7 depicts characteristics of thin-film solar batteries according to the Examples and the comparative example. While the short-circuit current in the thin-film solar battery of the comparative example is 17.8 milliamperes, the short-circuit currents in the thin-film solar batteries of the Examples 1 and 2 are 19.1 milliamperes and 18.3 milliamperes, respectively, and are increased as compared to the comparative example. The open circuit voltages in the Examples 1 and 2 have substantially no difference to the value (0.53 volt) of the open circuit voltage in the comparative example. A fill factor (FF) in the Example 1 is 0.698, which is slightly lower than the value (0.725) in the comparative example. However, the FF in the Example 2 is almost at the same level as the value in the comparative example. In addition, the photoelectric conversion efficiency in the Examples 1 and 2 is 6.93% and 6.98%, respectively, and each of which is increased as compared to 6.84% in the comparative example.

As described above, in the thin-film solar battery of the Example 1, the white insulating layer 17 is provided on the photoelectric conversion layer 13 on which the back-surface electrode layer 14 with fine linear structure is provided. Furthermore, in the thin-film solar battery of the Example 2, the transparent conductive film 15A is formed on the entire surface of the photoelectric conversion layer 13, the metal film 16 with fine linear structure is provided on the photoelectric conversion layer 13, and the white insulating layer 17 is further provided on the metal film 16. Therefore, the optical path length of incident solar light in the photoelectric conversion layer 13 is increased, and accordingly the photoelectric conversion efficiency can be enhanced as compared to the comparative example.

INDUSTRIAL APPLICABILITY

As described above, the thin-film solar battery according to the present invention is useful for solar batteries in which a photoelectric conversion layer is made of a thin film.

REFERENCE SIGNS LIST 10 unit solar battery cell
11 transparent insulating substrate
12 surface electrode layer
13 photoelectric conversion layer
14 back-surface electrode layer
15, 15A transparent conductive film
16 metal film
16a connecting part
17 white insulating layer
20 scribe line
21 first scribe line
22 second scribe line
23 third scribe line

The invention claimed is:

1. A thin-film solar battery comprising a plurality of cells, wherein each cell includes a first electrode layer made of a transparent conductive material, a photoelectric conversion layer made of a semiconductor material, and a second electrode layer made of a conductive material is formed on a translucent substrate, and the plurality of the cells are connected in series, wherein the thin-film solar battery further comprises, between adjacent cells of the plurality of the cells, a first electrode layer separating groove that separates the first electrode layer between adjacent cells, a second electrode layer separating groove that separates the second electrode layer between adjacent cells, and a cell connecting groove that is provided between the first electrode layer separating groove and the second electrode layer separating groove, and electrically connects the second electrode layer of one cell of the adjacent cells and the first electrode layer of the other cell, and the thin-film solar battery further comprises a reflective film made of a white insulating layer on the second electrode layer, wherein the second electrode layer has a structure in which a transparent conductive film and a metal film are stacked in this order on the photoelectric conversion layer, the metal film is patterned into lines which extend into the connecting groove and are connected to the first electrode layer of the adjacent cell, wherein the lines of the metal film have a line width within the connecting groove which is the same as a line width outside the connecting groove, and the reflective film is provided in an area of the connecting groove where the metal film is not formed and in the second electrode layer separating groove;

wherein the transparent conductive film is patterned into lines along with the metal film and the reflective film is formed directly on the photoelectric conversion layer in an area of the photoelectric conversion layer where the metal film is not formed.

2. The thin-film solar battery according to claim 1, wherein the transparent conductive film has a thickness of 10 to 1,000 nanometers.

3. The thin-film solar battery according to claim 1, wherein the transparent conductive film and the metal film of the second electrode layer are patterned to have a width of 10 to 1,000 micrometers.

4. The thin-film solar battery according to claim 1, wherein the transparent conductive film has a thickness of 10 to 500 nanometers.

5. The thin-film solar battery according to claim 1, wherein the metal film is patterned to have a width of 10 to 1,000 micrometers.

6. The thin-film solar battery according to claim 1, wherein the reflective film is made of white pigment and binder resin.

7. A manufacturing method of a thin-film solar battery, comprising:
- a first step of forming a film made of a transparent conductive material on a translucent substrate and forming a first separating groove that separates cells from each other to form a first electrode layer of each of the cells;
- a second step of forming a photoelectric conversion layer including a thin-film semiconductor layer on the substrate on which the first electrode layer is formed;
- a third step of forming a transparent conductive film on the photoelectric conversion layer;
- a fourth step of, in parallel to the first separating groove, forming a second separating groove that separates the transparent conductive film and the photoelectric conversion layer in the respective cells;
- a fifth step of forming a metal film with linear structure on the transparent conductive film and within the second separating groove such that, at a position where the second separating grove is formed, the metal film is connected to the first electrode layer at a bottom of the second separating groove;
- a sixth step of forming a third separating groove that separates the metal film, the transparent conductive film, and the photoelectric conversion layer in the respective cells in parallel to the first separating groove; and
- a seventh step of forming a reflective film made of a white insulating layer on the substrate on which the metal film is formed so as to embed the second and third separating grooves with the reflective film, wherein
- at the fifth step, the transparent conductive film is patterned into lines along with the metal film, the lines having a line width within the second separating groove which is the same as a line width outside the second separating groove, and
- at the seventh step, the reflective film is formed directly on the photoelectric conversion layer in an area of the photoelectric conversion layer where the metal film is not formed.

8. The manufacturing method of a thin-film solar battery according to claim 7, wherein
- at the third step, the transparent conductive film is formed to extend, with a predetermined pitch in a second direction vertical to the first direction, and
- at the fifth step, the metal film is formed so as to embed the second separating groove with the metal film at a position where the metal film and the second separating groove intersect.

9. The manufacturing method of a thin-film solar battery according to claim 7, wherein
- at the third step, the transparent conductive film is formed on an entire surface of the photoelectric conversion layer, and
- at the fifth step, the metal film that extends, with a predetermined pitch in a first direction in which the first separating groove extends, in a second direction vertical to the first direction is formed.

10. The manufacturing method of a thin-film solar battery according to claim 9, wherein at the fifth step, a process of etching the transparent conductive film by using the metal film as a mask is further performed after forming the metal film patterned into lines.

* * * * *